(12) United States Patent
Foreman et al.

(10) Patent No.: US 10,691,853 B2
(45) Date of Patent: Jun. 23, 2020

(54) SUPERPOSITION OF CANONICAL TIMING VALUE REPRESENTATIONS IN STATISTICAL STATIC TIMING ANALYSIS

(71) Applicant: International Business Machines Corporation, Armonk, NY (US)

(72) Inventors: Eric Foreman, Fairfax, VT (US); James Gregerson, Hyde Park, NY (US); Gregory Schaeffer, Poughkeepsie, NY (US); Michael H. Wood, Wilmington, DE (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/169,243

(22) Filed: Oct. 24, 2018

(65) Prior Publication Data
US 2020/0134114 A1   Apr. 30, 2020

(51) Int. Cl.
*G06F 30/30* (2020.01)
*G06F 17/10* (2006.01)
(Continued)

(52) U.S. Cl.
CPC .......... *G06F 30/3312* (2020.01); *G06F 17/16* (2013.01); *G06F 17/18* (2013.01); *G06F 30/327* (2020.01)

(58) Field of Classification Search
CPC .............................. G06F 17/16; G06F 17/5031
(Continued)

(56) References Cited

U.S. PATENT DOCUMENTS

| 7,086,023 B2 * | 8/2006 | Visweswariah ..... G06F 17/5031 716/108 |
| 7,474,999 B2 | 1/2009 | Scheffer |

(Continued)

FOREIGN PATENT DOCUMENTS

WO   2010019147 A1   2/2010

OTHER PUBLICATIONS

Chawla, Tarun "Study of the impact of variations of fabrication procses on digital circuits", Mirco and nanotechnologies/Microelectronics, 2010, pp. 1-210.

*Primary Examiner* — Sun J Lin
(74) *Attorney, Agent, or Firm* — Cantor Colburn LLP; Erik Johnson

(57) ABSTRACT

A system and method to perform timing analysis in integrated circuit development involves defining an integrated circuit design as nodes representing components of the integrated circuit design that are interconnected by edges representing wires. Sequentially connected nodes define a path. Statistical variables are defined for a canonical delay model of each node and edge of the integrated circuit design and define a first set of conditions. The method includes performing a statistical static timing analysis to obtain an arrival time at each node as a sum of the canonical delay models for nodes and edges that precede the node in the path of the node, obtaining a projected arrival time at a second set of conditions for the node by scaling the arrival time for the node using scale factors that represent the second set of conditions and using a transformation matrix, and providing the integrated circuit design for fabrication.

20 Claims, 4 Drawing Sheets

(51) Int. Cl.
*G06F 30/3312* (2020.01)
*G06F 17/16* (2006.01)
*G06F 17/18* (2006.01)
*G06F 30/327* (2020.01)
*G06F 17/50* (2006.01)

(58) Field of Classification Search
USPC .................................................. 716/110, 113
See application file for complete search history.

(56) References Cited

U.S. PATENT DOCUMENTS

| | | | |
|---|---|---|---|
| 7,873,926 B2 * | 1/2011 | Buck et al. ......... | G06F 17/5031 |
| | | | 716/104 |
| 8,086,976 B2 * | 12/2011 | Hemmett et al. ... | G06F 17/5031 |
| | | | 703/19 |
| 8,086,983 B2 | 12/2011 | Shrivastava et al. | |
| 8,555,235 B2 | 10/2013 | Oh et al. | |
| 8,645,881 B1 | 2/2014 | Kriplani et al. | |
| 9,378,328 B2 | 6/2016 | Buck et al. | |
| 9,619,609 B1 | 4/2017 | Bickford et al. | |
| 2017/0039310 A1 | 2/2017 | Wang et al. | |

* cited by examiner

SUPERPOSITION OF CANONICAL TIMING VALUE REPRESENTATIONS IN STATISTICAL STATIC TIMING ANALYSIS

BACKGROUND

The present invention relates to integrated circuit development, and more specifically, to the superposition of canonical timing value representations in statistical static timing analysis (SSTA).

The development of an integrated circuit involves many phases from developing a high-level logic design to fabricating a final design into the physical implementation of the integrated circuit (i.e., chip). An electronic design automation (EDA) tool can be used to perform many of the processes such as logic synthesis and physical synthesis. In addition to ensuring that the chip logic performs the desired functions, tests and processes throughout the development also ensure that timing and power requirements of the chip are met. Thus, timing analysis is performed at different phases and can be performed iteratively.

SUMMARY

Embodiments of the present invention are directed to systems and methods to perform timing analysis in integrated circuit development. The method includes defining an integrated circuit design as nodes representing components of the integrated circuit design that are interconnected by edges representing wires. Each set of nodes that is sequentially connected by edges defines a path. The method also includes defining n statistical variables for a canonical delay model of each node and edge of the integrated circuit design, the n statistical variables defining a first set of conditions, and defining a transformation matrix as an n by n matrix. A statistical static timing analysis is performed to obtain an arrival time at each node as a sum of the canonical delay models for one or more of the nodes and one or more of the edges that precede the node in the path that includes the node. A projected arrival time is obtained at a second set of conditions, different than the first set of conditions defined by the n statistical variables, for one or more nodes by scaling the arrival time for the one or more nodes using scale factors that represent the second set of conditions and using the transformation matrix. The integrated circuit design is provided for fabrication.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

Figure 1:
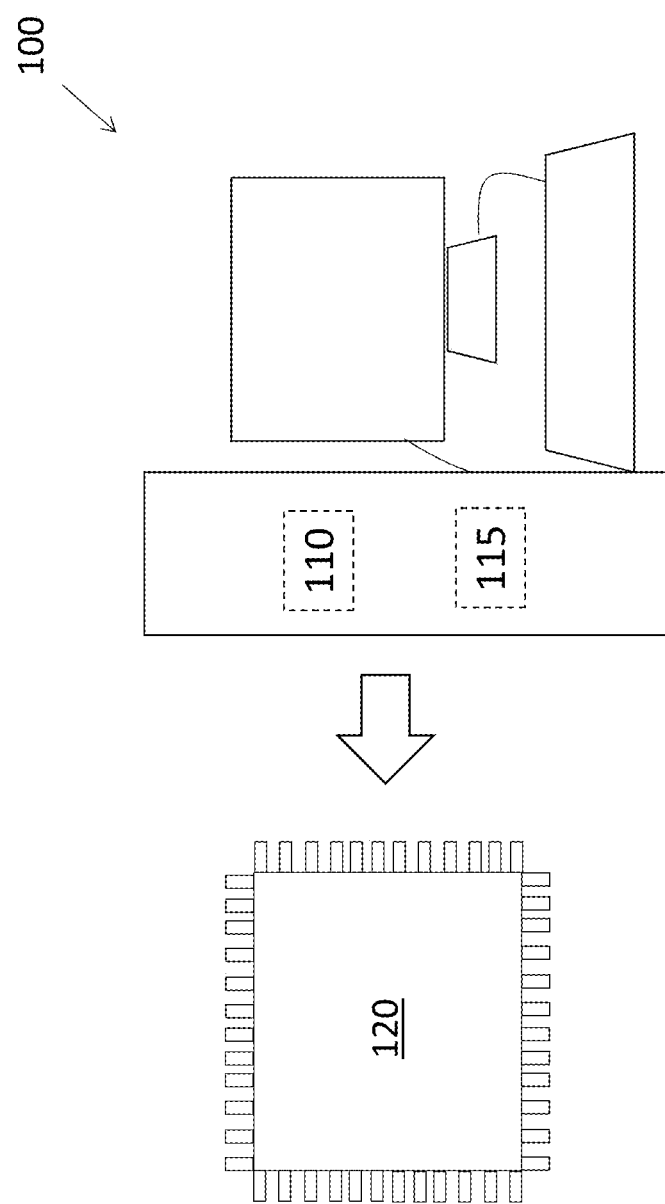
FIG. 1 is a block diagram of a system to perform statistical static timing analysis (SSTA) according to one or more embodiments of the invention.

As previously noted, the development of an integrated circuit from the logic design through the fabrication of a final design involves several processes, some of which can be performed iteratively and at different phases. Timing analysis is the process of determining the amount of time (i.e., delay) of a signal through a set of components, which can be referred to as nodes. Timing analysis of the chip design helps to ensure that the fabricated chip meets all timing constraints. Specifically, the results of timing analysis help to identify areas of the chip that are not meeting timing requirements (i.e., the delay is exceeding the specified timing constraint) and, thus, require redesign. Timing analysis can be performed on some or all of the components (e.g., logic gates, latches, buffers) of the integrated circuit. For example, during the design process, the integrated circuit can be subdivided into units that each include a set of macros. This hierarchical approach can include more levels, as well. Timing analysis can be performed at the macro level, the unit level, or another hierarchical level, as well as at the chip level. Timing analysis can also be performed at different levels of detail. For example, a less detailed or accurate timing result can provide an initial snapshot of areas of the integrated circuit design that are not meeting timing requirements (i.e., have negative timing slack), while a more detailed timing result can be helpful during design changes of small portions of the design.

Static timing analysis (STA) is a process that provides a less detailed or accurate timing result but takes less time and computing resources than other techniques. When STA is performed for a set of nodes, a single arrival time (AT) value at an input node is propagated through the set of nodes. That is, the AT at the input node is added to delay associated with the input node and the edge (i.e., connection) to the next node among the set of nodes. This sum is the arrival time at the next node and can be compared with the required arrival time (RAT) at that next node. For example, the next node can be a storage element, and the RAT can ensure that the data signal arrives at the storage element early enough for valid gating but not so early as to cause premature gating. The delay associated with that next node (e.g., storage element) is then added to the sum, along with the delay through a next edge to a subsequent node to obtain the AT at that subsequent node. In this manner, the AT at the input node is propagated through from node-to-node to an output node. The set of nodes can be the components of a macro, unit, core, or the entire chip. Dynamic timing analysis (DTA) refers to a process of performing a full timing simulation and is computationally intensive.

The simplicity of the STA approach is based, in part, on the fact that a single value is used for delay and AT. This deterministic timing considers a single set of conditions, referred to as a corner, at each node. A single corner can be a single set of values for process variation-supply voltage variation-operating temperature variation (PVT), for example. Process variation accounts for deviations in the fabrication process that can result from variations in temperature, pressure, dopant concentrations, and other factors. Supply voltage variation and operating temperature variation can occur during operation of the chip. Any number of sources of variation can be considered within the categories of PVT (e.g., process variation can include physical parameter variation, electrical parameter variation). The embodiments detailed herein pertain to statistical STA (SSTA). In SSTA, delay variations are considered statistically, as a probability distribution. A canonical delay model can be used to represent a distribution relative to the sources of variation that are considered. Conventionally, each corner of interest (i.e., the particular combination of values for the sources of variation) must be separately processed. Yet, the corners that are provided as part of a PVT library, for example, may not include one or more corners of interest.

Embodiments of the systems and methods detailed herein involve the superposition or projection of timing values (e.g., delay, AT values, slew) to a corner that was not actually processed. As discussed, a transform is applied to vectors of the canonical model. In addition to considered corners that were not processed, the systems and method according to embodiments of the invention facilitate second-order terms (e.g., consideration of process change or temperature change as voltage changes rather than process change, temperature change, or voltage change alone).

FIG. 1 is a block diagram of a system 100 to perform SSTA according to one or more embodiments of the invention. The system 100 includes processing circuitry 110 and memory 115 that is used to generate the design that is ultimately fabricated into an integrated circuit 120. The steps involved in the fabrication of the integrated circuit 120 are well-known and only briefly described herein and with reference to FIG. 4. The physical layout is finalized, in part, based on the SADP-aware routing according to embodiments of the invention. The finalized physical layout is provided to a foundry. Masks are generated for each layer of the integrated circuit 120 based on the finalized physical layout. Then, the wafer is processed in the sequence of the mask order. The processing includes photolithography and etch. The fabrication is further discussed with reference to FIG. 4.

Figure 2:
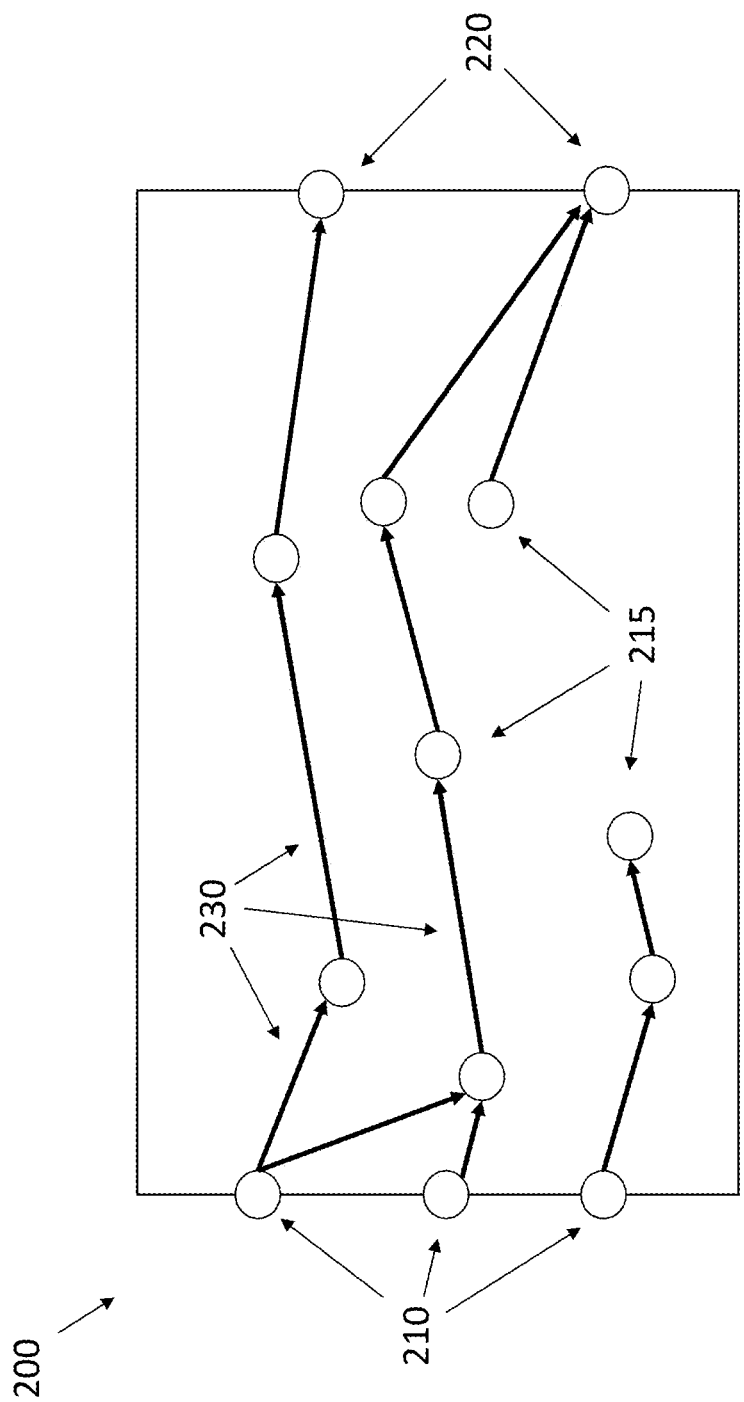
FIG. 2 is a block diagram of an exemplary hierarchical level of the integrated circuit for which SSTA is performed using superposition of canonical delay according to one or more embodiments of the invention.

FIG. 2 is a block diagram of an exemplary hierarchical level 200 of the integrated circuit 120 for which SSTA is performed using superposition of canonical timing value representations (e.g., delay) according to one or more embodiments of the invention. The hierarchical level 200 shown can be the entire chip, a core, a unit, or a macro, for example. Input nodes 210 and output nodes 220 are shown along with other nodes 215. The nodes 210, 215, 220 are interconnected by edges 230 that represent wires of the integrated circuit 120. Each node 210, 215, 220 can be a logic gate (e.g., inverter), storage element, or another component. As previously outlined for STA, SSTA involves propagating AT from one node 210, 215, 220 to the next. The AT at a given node 215, 220 or the timing of a path along a set of nodes 210, 215, 220 can be compared with the corresponding RAT to determine slack. Timing tests can be conducted based on the SSTA, as well.

Unlike STA, SSTA does not involve a single value for the delay and AT. Instead, each delay and AT is a Gaussian random variable, which takes into account the Gaussian distributions of all the sources of variation that are considered. The delay can be expressed as a canonical model, referred to as a canonical delay, in the form of a vector that includes a mean value and one or more sensitivity values. Each sensitivity value pertains to a source of variation and the combination of sensitivity values represents one corner. As previously noted, each corner (i.e., set of sensitivity values, represented by an AT vector) requires a separate SSTA timing analysis run according to prior approaches. As detailed with reference to FIG. 3, results from a single SSTA run using a single corner can be projected to additional corners according to one or more embodiments of the invention. Specifically, a transform is defined that facilitates superposition of canonical delay into a parameter space (i.e., corner or combination of variation values). The superposition can be to a parameter space or corner that was not even provided previously (e.g., in the PVT library).

Figure 3:
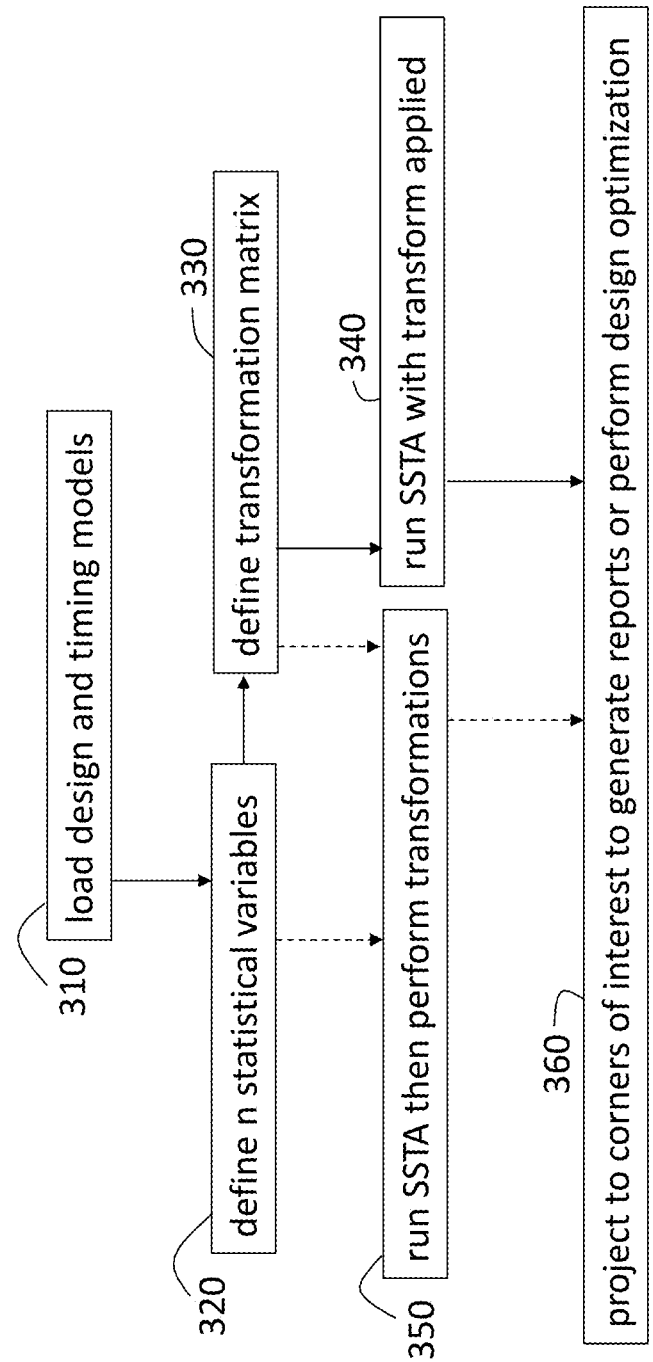
FIG. 3 is a process flow of a method of performing SSTA that includes the superposition of canonical delay according to one or more embodiments of the invention.

FIG. 3 is a process flow of a method of performing SSTA that includes the superposition of canonical timing value representations according to one or more embodiments of the invention. At block 310, loading the design and timing models includes defining the hierarchical level 200 (e.g., the input nodes 210, 215, 220 and edges 230) to be analyzed and obtaining timing models for the hierarchical level 200. Timing models can be obtained from a library, for example, to abstract or simplify the design such that timing analysis can be performed more efficiently. Defining n statistical variables, at block 320, refers to defining the canonical delay, represented as the vector of mean and n sensitivity values corresponding to n sources of variation, for each node 210, 215, 220 and edge 230. At block 330, defining an n×n transformation matrix of transforms can be performed in different ways. Known simulation models (e.g., SPICE models) can be performed to obtain the response of a representative circuit and determine the transforms, or a test circuit can be built and responses can be measured under different conditions.

The transformation matrix is used to project the canonical delay that is defined for a given corner, at block 320, to additional corners. Although delay is discussed for explanatory purposes, a vector that is a canonical representation of AT, which results from downstream propagation of arrival times and delays, can be similarly transformed and projected. However, when a timing value (e.g., slack) that requires a difference of two vectors (e.g., RAT and AT) is obtained, the transformation and projection is performed for the difference result rather than for each vector prior to the subtraction to ensure that no information is lost. For a given node 210, 215, 220 or edge 230, the canonical delay can be expressed as a vector x of $[x_0 \, x_1 \ldots x_n]$, where $x_0$ is a mean value, $x_1$ is a sensitivity value for one source of variation, and $x_n$ is a sensitivity value for the nth source of variation that is part of the given corner. Once the n statistical variables that define the canonical delay at each node are defined (at block 320) and the n×n transformation matrix is defined (at block 330), the subsequent processes can be performed in two different orders, according to different embodiments of the invention.

According to an exemplary embodiment of the invention, at block 340, the canonical delay defined at block 320 is transformed, using the transformation matrix defined at block 330, during the SSTA run. That is, the transformed canonical delays, obtained at block 330, are propagated rather than the canonical delay, defined at block 320. Assuming an initial AT of 0 at a given input node 210, the delay associated with the given input node 210 is added to the delay through the corresponding edge 230 to obtain the AT at the next node 215, 220. According to the exemplary embodiment, at block 340, the transformed canonical delay (vector y rather than vector x) of the input node 210 and the edge 230 are added to provide the AT at the next node 215, 220. Then, the transformed canonical delay at that next node 215, 220 is added to this AT to determine the AT at the subsequent node 215, 220. In this manner, the transformed canonical delay is propagated as part of the SSTA.

According to an alternate embodiment of the invention, at block 350, the SSTA run is performed, and then the transformation is done at nodes 210, 215, 220 of interest. That is, the canonical delay (vector x) is propagated from a given input node 210 to subsequent nodes 215, 220 in each path. As previously noted, assuming that an initial AT is 0 at a given input node 210, the delay associated with the given input node 210 is added to the delay through the corresponding edge 230 to obtain the AT at the next node 215, 220. According to the exemplary embodiment, at block 340, the canonical delay (vector x) of the input node 210 and the edge 230 are added to provide the AT at the next node 215, 220. Then, the canonical delay at that next node 215, 220 is added to this AT to determine the AT at the subsequent node 215, 220. In this manner, the canonical delay is propagated as part of the SSTA. At any node 210, 215, 220 of interest, the AT is transformed prior to performing any timing tests, for example.

Whether timing propagation uses transformed canonical delays and ATs (at block 340) or uses canonical delays and ATs that are then transformed, as needed (at block 350), the processes at block 360 can be performed. Projecting to corners of interest to generate reports or perform design optimization, at block 360, refers to the fact that timing tests (e.g., determining whether the data signal arrived before the timing signal at a node that is a flip-flop) and slack determination generally require a single value rather than a canonical representation. As previously noted, slack can be determined as the difference between AT and RAT, with RAT being a single value. Thus, projecting to a corner of interest, at block 360, involves obtaining a single value. For a corner of interest, the delay can be expressed by the following:

$$\text{delay} = \begin{bmatrix} x_0 \\ x_1 \\ \vdots \\ x_n \end{bmatrix} \begin{bmatrix} \Delta X_1 \\ \vdots \\ \Delta X_n \end{bmatrix} \quad [\text{EQ. 1}]$$

According to EQ. 1, each of the sensitivity values can be multiplied by an amount of deviation from the nominal or weight ($\Delta X$) defining the corner. For example, $x_1$ can be temperature and $\Delta X_1$ can be 3, representing the 3 sigma value of the Gaussian distribution of temperature variation. Using EQ. 1, the canonical delay for the corner of interest can be expressed as:

$$\text{delay} = x_0 + x_1 \Delta X_1 + x_2 \Delta X_2 + \ldots + x_n \Delta X_n \quad [\text{EQ. 2}]$$

The transformed canonical delay (TCD), obtained at block 340 or 350, requires a transformation of the canonical delay model represented by $x=[x_0 \ x_1 \ \ldots \ x_n]$ using the n×n transformation matrix, to obtain transformed vector y:

$$y = \begin{bmatrix} y_0 \\ y_1 \\ \vdots \\ y_n \end{bmatrix} = \begin{bmatrix} \alpha_{0,0} & \alpha_{0,1} & \ldots & \alpha_{0,n} \\ \alpha_{1,0} & \alpha_{1,1} & \ldots & \alpha_{1,n} \\ \vdots & \vdots & \ddots & \vdots \\ \alpha_{n,0} & \alpha_{n,1} & \ldots & \alpha_{n,n} \end{bmatrix} * \begin{bmatrix} x_0 \\ x_1 \\ \vdots \\ x_n \end{bmatrix} \quad [\text{EQ. 3}]$$

As previously noted, the transformation matrix can be obtained in several different ways (e.g., SPICE simulations, with a test circuit). The transformed canonical delay (TCD) (or transformed AT, which is obtained from delays, as discussed previously) can be projected to corners (specified by the combination of $\Delta Y_1, \Delta Y_2, \ldots, \Delta Y_n$) that were not considered or provided as part of the canonical model represented as the vector $x=[x_0 \ x_1 \ \ldots \ x_n]$. The TCD is obtained similarly to delay, as shown in EQ. 1:

$$TCD = \begin{bmatrix} y_0 \\ y_1 \\ \vdots \\ y_n \end{bmatrix} \begin{bmatrix} \Delta Y_1 \\ \vdots \\ \Delta Y_n \end{bmatrix} \quad [\text{EQ. 4}]$$

For example, slack can be determined at four different corners based on four different combinations of $\Delta Y_1, \Delta Y_2, \ldots, \Delta Y_n$. Then it can be determined if slack is greater than or equal to 0 at all of the four corners. If not, a design change can be undertaken. Alternately, it can be determined that operation of the integrated circuit at the corners for which slack is below 0 is unlikely and, thus, design changes are not warranted. The transformed and projected canonical delay according to EQ. 3 can also be expressed as the following $$TCD = \begin{bmatrix} y_0 \\ y_1 \\ \vdots \\ y_n \end{bmatrix} \begin{bmatrix} \Delta Y_1 \\ \vdots \\ \Delta Y_n \end{bmatrix} = \begin{bmatrix} \alpha_{0,0} & \alpha_{0,1} & \ldots & \alpha_{0,n} \\ \alpha_{1,0} & \alpha_{1,1} & \ldots & \alpha_{1,n} \\ \vdots & \vdots & \ddots & \vdots \\ \alpha_{n,0} & \alpha_{n,1} & \ldots & \alpha_{n,n} \end{bmatrix} * \begin{bmatrix} x_0 \\ x_1 \\ \vdots \\ x_n \end{bmatrix} \begin{bmatrix} \Delta X_1 \\ \vdots \\ \Delta X_n \end{bmatrix} \quad [\text{EQ. 5}]$$

$$TCD = [\alpha_{0,0} * x_0 + \alpha_{0,1} * x_1 + \alpha_{0,2} * x_2 + \ldots + \alpha_{0,n} * x_n] + [\alpha_{1,0} * x_0 + \alpha_{1,1} * x_1 + \alpha_{1,2} * x_2 + \ldots + \alpha_{1,n} * x_n] x_1 \Delta X_1 + \ldots + [\alpha_{n,0} * x_0 + \alpha_{n,1} * x_1 + \alpha_{n,2} * x_2 + \ldots + \alpha_{n,n} * x_n] x_n X_n \quad [\text{EQ. 6}]$$

Based on using the transformation matrix and scale factors, according to one or more embodiments of the invention, second-order terms can be used to scale a parameter differently at different corners. According to an exemplary embodiment, EQ. 5 can include a second-order term as indicated below:

$$\begin{bmatrix} y_0 \\ y_1 \\ y_2 \\ y_1 y_2 \\ \vdots \\ y_n \end{bmatrix} \begin{bmatrix} \Delta Y_1 \\ \Delta Y_2 \\ \Delta Y_{12} \\ \vdots \\ \Delta Y_n \end{bmatrix} = \begin{bmatrix} \alpha_{0,0} & \alpha_{0,1} & \ldots & \alpha_{0,n} \\ \alpha_{1,0} & \alpha_{1,1} & \ldots & \alpha_{1,n} \\ \vdots & \vdots & \ddots & \vdots \\ \alpha_{n,0} & \alpha_{n,1} & \ldots & \alpha_{n,n} \end{bmatrix} * \begin{bmatrix} x_0 \\ x_1 \\ x_2 \\ x_1 x_2 \\ \vdots \\ x_n \end{bmatrix} \begin{bmatrix} \Delta X_1 \\ \Delta X_2 \\ \Delta X_{12} \\ \vdots \\ \Delta X_n \end{bmatrix} \quad [\text{EQ. 7}]$$

For example, $x_1$ can be process speed and $x_2$ can be voltage. Then the cross term, $x_1 x_2$, allows consideration of how process speed changes with a change in voltage. While $\Delta X_1$ and $\Delta X_2$ are scaling factors to project process speed and voltage, respectively, to particular points on their respective Gaussian distributions, $\Delta X_{12}$ scales the process speed and voltage differently than $\Delta X_1$ and $\Delta X_2$.

Figure 4:
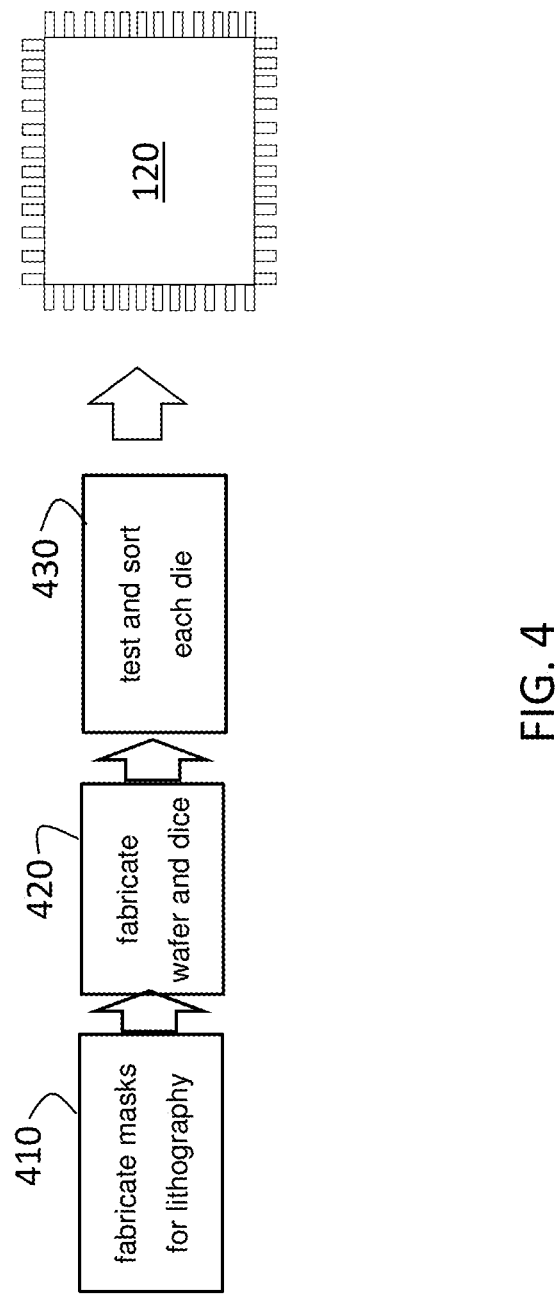
FIG. 4 is a process flow of a method of fabricating the integrated circuit designed according to one or more embodiments of the invention.

FIG. 4 is a process flow of a method of fabricating the integrated circuit 120 designed according to one or more embodiments of the invention. Once the physical design data is obtained, based, in part, on performing SSTA according to one or more embodiments of the invention to ensure that the integrated circuit design will meet timing constraints at least at the corners of interest, the processes shown in FIG. 4 can be performed to fabricate the integrated circuit 120. Generally, a wafer with multiple copies of the final design is fabricated and cut (i.e., diced) such that each die is one copy of the integrated circuit 120. At block 410, the processes include fabricating masks for lithography based on the finalized physical layout. At block 420, fabricating the wafer includes using the masks to perform photolithography and etching. Once the wafer is diced, testing and sorting each die is performed, at block 430, to filter out any faulty die.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of performing timing analysis in integrated circuit development, the method comprising:
    defining an integrated circuit design as nodes representing components of the integrated circuit design that are interconnected by edges representing wires, wherein each set of nodes that is sequentially connected by edges defines a path;
    defining n statistical variables for a canonical delay model of each node and each edge of the integrated circuit design, wherein the n statistical variables define a first set of conditions;
    defining a transformation matrix as an n by n matrix;
    performing a statistical static timing analysis to obtain an arrival time at each node as a sum of the canonical delay models for one or more of the nodes and one or more of the edges that precede the node in the path that includes the node;
    obtaining a projected arrival time at a second set of conditions, different than the first set of conditions defined by the n statistical variables, for one or more nodes by scaling the arrival time for the one or more nodes using scale factors that represent the second set of conditions and using the transformation matrix; and
    providing the integrated circuit design for fabrication.

2. The computer-implemented method according to claim 1, wherein the using the transformation matrix is performed for every canonical delay model of every node and every edge during the statistical static timing analysis.

3. The computer-implemented method according to claim 1, wherein the using the transformation matrix is performed on the arrival time or on a timing value obtained from a difference between the arrival time and one or more other vectors at the one or more nodes.

4. The computer-implemented method according to claim 1, wherein the obtaining the projected arrival time at the second set of conditions for the one or more nodes includes obtaining a single value for each of the one or more nodes.

5. The computer-implemented method according to claim 4, further comprising determining a slack value at each of the one or more nodes for the second set of conditions by subtracting the projected arrival time at the second set of conditions from a corresponding required arrival time value.

6. The computer-implemented method according to claim 5, further comprising performing the obtaining a projected arrival time at additional sets of conditions and performing the determining a slack value at the additional sets of conditions.

7. The computer-implemented method according to claim 1, wherein the defining the n statistical variables for the canonical delay model includes defining one of the n statistical variables as a combination of two others of the n statistical variables.

8. A system to perform timing analysis in integrated circuit development, the system comprising:
    a memory device configured to store an integrated circuit design as nodes representing components of the integrated circuit design that are interconnected by edges representing wires, wherein each set of nodes that is sequentially connected by edges defines a path; and
    a processor configured to define n statistical variables for a canonical delay model of each node and each edge of the integrated circuit design, wherein the n statistical variables define a first set of conditions, to define a transformation matrix as an n by n matrix, to perform a statistical static timing analysis to obtain an arrival time at each node as a sum of the canonical delay models for one or more of the nodes and one or more of the edges that precede the node in the path that includes the node, and to obtain a projected arrival time at a second set of conditions, different than the first set of conditions defined by the n statistical variables, for one or more nodes by scaling the arrival time for the one or more nodes using scale factors that represent the second set of conditions and using the transformation matrix, wherein the integrated circuit design is provided for fabrication.

9. The system according to claim 8, wherein the processor is configured to use the transformation matrix for every canonical delay model of every node and every edge during the statistical timing analysis.

10. The system according to claim 8, wherein the processor is configured to use the transformation matrix on the arrival time or on a timing value obtained from a difference between the arrival time and one or more other vectors at the one or more nodes.

11. The system according to claim 8, wherein the processor obtains the projected arrival time at the second set of conditions for the one or more nodes as a single value for each of the one or more nodes.

12. The system according to claim 11, wherein the processor is further configured to determine a slack value at each of the one or more nodes for the second set of conditions by subtracting the projected arrival time at the second set of conditions from a corresponding required arrival time value.

13. The system according to claim 12, wherein the processor is further configured to obtain a projected arrival time at additional sets of conditions and to determine a slack value at the additional sets of conditions.

14. The system according to claim 8, wherein the processor defining the n statistical variables for the canonical delay model includes defining one of the n statistical variables as a combination of two others of the n statistical variables.

15. A computer program product for performing timing analysis in integrated circuit development, the computer program product comprising a non-transitory computer readable storage medium having program instructions embodied therewith, the program instructions executable by a processor to perform a method comprising:

defining an integrated circuit design as nodes representing components of the integrated circuit design that are interconnected by edges representing wires, wherein each set of nodes that is sequentially connected by edges defines a path;

defining n statistical variables for a canonical delay model of each node and each edge of the integrated circuit design, wherein the n statistical variables define a first set of conditions;

defining a transformation matrix as an n by n matrix;

performing a statistical static timing analysis to obtain an arrival time at each node as a sum of the canonical delay models for one or more of the nodes and one or more of the edges that precede the node in the path that includes the node;

obtaining a projected arrival time at a second set of conditions, different than the first set of conditions defined by the n statistical variables, for one or more nodes by scaling the arrival time for the one or more nodes using scale factors that represent the second set of conditions and using the transformation matrix, wherein the integrated circuit design is provided for fabrication.

16. The computer program product according to claim 15, wherein the using the transformation matrix is performed for every canonical delay model of every node and every edge during the statistical timing analysis.

17. The computer program product according to claim 15, wherein the using the transformation matrix is performed on the arrival time or on a timing value obtained from a difference between the arrival time and one or more other vectors at the one or more nodes.

18. The computer program product according to claim 15, further comprising determining a slack value at each of the one or more nodes for the second set of conditions by subtracting the projected arrival time at the second set of conditions from a corresponding required arrival time value, wherein the obtaining the projected arrival time at the second set of conditions for the one or more nodes includes obtaining a single value for each of the one or more nodes.

19. The computer program product according to claim 18, further comprising performing the obtaining a projected arrival time at additional sets of conditions and performing the determining a slack value at the additional sets of conditions.

20. The computer program product according to claim 15, wherein the defining the n statistical variables for the canonical delay model includes defining one of the n statistical variables as a combination of two others of the n statistical variables.

* * * * *